(12) United States Patent
Hanazaki

(10) Patent No.: US 9,306,355 B2
(45) Date of Patent: Apr. 5, 2016

(54) CONNECTION METHOD BETWEEN BRAIDED SHIELD LAYER OF SHILED WIRE AND DRAIN WIRE, AND CONNECTION STRUCTURE OF THE SAME

(75) Inventor: Hisashi Hanazaki, Makinohara (JP)

(73) Assignee: Yazaki Corporation, Tokyo (JP)

( * ) Notice: Subject to any disclaimer, the term of this patent is extended or adjusted under 35 U.S.C. 154(b) by 106 days.

(21) Appl. No.: 14/241,535

(22) PCT Filed: Aug. 29, 2012

(86) PCT No.: PCT/JP2012/005429
§ 371 (c)(1),
(2), (4) Date: Dec. 17, 2014

(87) PCT Pub. No.: WO2013/031204
PCT Pub. Date: Mar. 7, 2013

(65) Prior Publication Data
US 2015/0129297 A1 May 14, 2015

(30) Foreign Application Priority Data
Aug. 31, 2011 (JP) .................. 2011-188799

(51) Int. Cl.
*H05K 9/00* (2006.01)
*H01R 43/048* (2006.01)
*H01R 4/20* (2006.01)
(Continued)

(52) U.S. Cl.
CPC ............. *H01R 43/048* (2013.01); *H01B 5/12* (2013.01); *H01R 4/20* (2013.01); *H01R 4/66* (2013.01); *H01R 9/0512* (2013.01);
(Continued)

(58) Field of Classification Search
CPC ............................ H01R 4/20; H05K 9/0098
See application file for complete search history.

(56) References Cited

U.S. PATENT DOCUMENTS 7,044,756 B1 5/2006 Asakura et al.
7,268,298 B2 9/2007 Asakura et al.
(Continued)

FOREIGN PATENT DOCUMENTS

JP 2006-156299 A 6/2006
JP 2007-184172 A 7/2007
WO WO-2011/152415 A1 12/2011

OTHER PUBLICATIONS

Office Action mailed Mar. 17, 2015, issued for the Japanese patent application No. 2011-188799 and English translation thereof.
International Search Report and Written Opinion mailed Oct. 25, 2012, issued for PCT/JP2012/005429.

*Primary Examiner* — Hung V Ngo
(74) *Attorney, Agent, or Firm* — Locke Lord LLP; James E. Armstrong, IV; Brian S. Matross

(57) ABSTRACT

[Technical Problem]
To provide a connection method between a braided shield layer of a shield wire and a drain wire, and a connection structure of the same enabling an easy and reliable connection, using no skilled operation such as soldering, and without an increase of non-shield area which is a problem when the braided shield layer is pulled out and a ground terminal is directly crimped onto the braided shield layer.
[Solution to Problem]
A connection method between a braided shield layer of a shield wire and a drain wire sequentially including the steps of a shield terminal insertion step; a shield layer folding and overlapping step; a drain wire overlapping step; a shield ring inserting step; and a crimping step.

3 Claims, 2 Drawing Sheets

(51) Int. Cl.
*H01R 4/66* (2006.01)
*H01R 9/05* (2006.01)
*H01B 5/12* (2006.01)

(52) U.S. Cl.
CPC ........... *H01R 9/0518* (2013.01); *H05K 9/0088* (2013.01); *H05K 9/0098* (2013.01); *Y10T 29/49199* (2015.01)

(56) References Cited

U.S. PATENT DOCUMENTS

| | | | |
|---|---|---|---|
| 7,368,664 B2 | 5/2008 | Asakura et al. | |
| 2006/0128223 A1 | 6/2006 | Asakura et al. | |
| 2009/0315419 A1* | 12/2009 | Mita | H01R 4/20 310/71 |

* cited by examiner

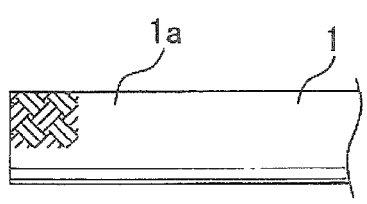
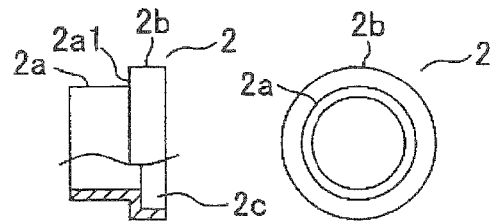
FIG. 1A  FIG. 1B
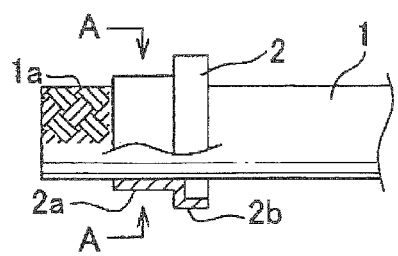
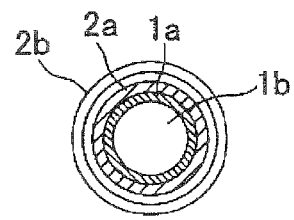
FIG. 1C
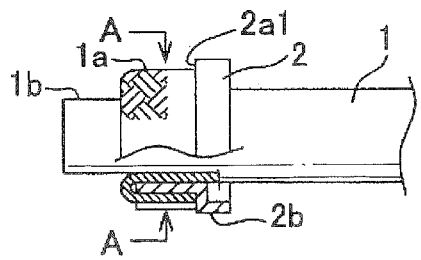
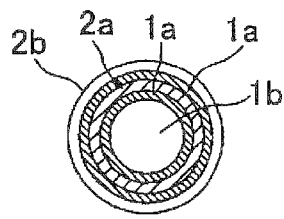
FIG. 1D
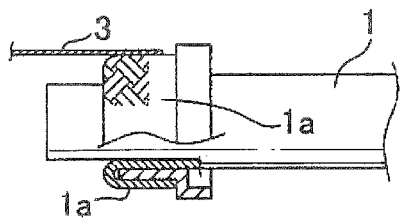
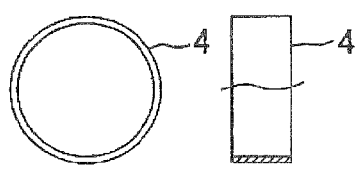
FIG. 1E  FIG. 1F
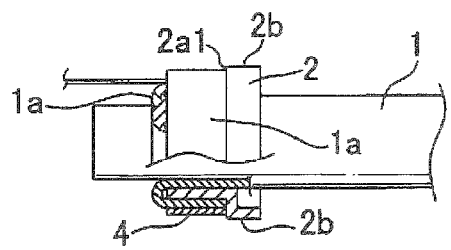
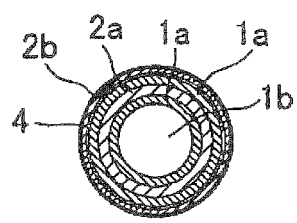
FIG. 1G

CONNECTION METHOD BETWEEN BRAIDED SHIELD LAYER OF SHILED WIRE AND DRAIN WIRE, AND CONNECTION STRUCTURE OF THE SAME

TECHNICAL FIELD

This invention relates to a connection method between a braided shield layer of a shield wire used for connecting with electric components such as a motor used in an electric vehicle or the like, and a drain wire for a ground connection.

BACK GROUND ART

A shield wire provided with a braided shield layer as the most outer layer formed by braiding a plurality of conductive wire bundles each composed of a plurality of conductive element wires is used for preventing an electromagnetic wave from leaking from a conductor to an outside, or for removing an influence of an electromagnetic wave to the conductor from the outside.

In these shield wires, normally the braided shield layer is electrically connected to ground for attaining a shield effect. For this purpose, a grounding wire, namely, a drain wire 3 and a braided shield layer 1a are electrically connected to each other as shown in FIG. 3. In an example of FIG. 3, they are connected by soldering (reference sign 5 denotes a soldering portion (PTL 1, PTL 2).

When the soldering temperature is high, and the time needed for soldering is long, so-called copper biting, namely, the copper on the soldering portion is melt and at last the snapping of a wire is generated at such a soldering spot. Therefore, there is a problem that reliability is reduced, and an operator must be skilled in soldering.

In contrast, according to PTL 1, the soldering is unnecessary by pulling out the braided. shield layer, and by directly crimping a ground terminal onto an end of the braided shield layer. However, according to this technique, a portion not protected by the shield is enlarged. As a result, there is a problem that the shield performance is reduced.

CITATION LIST

Patent Literature

[PTL 1]
JP, A, 2007-184172

SUMMARY OF INVENTION

Technical Problem

An object of the present invention is to provide a connection method between a braided shield layer of a shield wire and a drain wire, and a connection structure of the same enabling an easy and reliable connection, using no skilled operation such as soldering, and without an increase of non-shield area which is a problem when the braided shield layer is pulled out and a ground terminal is directly crimped onto the braided shield layer.

Solution to Problem

For attaining the object, according to the first aspect of the present invention, there is provided a connection method between a braided shield layer of a shield wire and a drain wire for electrically connecting the drain wire composed of a plurality of conductive element wires with the braided shield layer provided as a most outer layer formed by braiding a plurality of conductive wire bundles each composed of a plurality of conductive element wires thinner than the conductive element wires of the drain wire, said connection method sequentially including the steps of:

a shield terminal insertion step for inserting a ring-shaped shield terminal over a vicinity of an end of the shield wire;

a shield layer folding and overlapping step for folding an end side nearer than the shield terminal of the braided shield layer of the shield wire and overlapping with an outer peripheral wall of the shield terminal;

a drain wire overlapping step for overlapping the drain wire with a part of an outer side wall of the shield terminal where the braided shield layer is overlapped;

a shield ring inserting step for inserting the shield ring over the outer side wall where the braided shield layer is overlapped and a portion where the drain wire is overlapped; and a crimping step for pressing a portion of the shield ring corresponding to the portion where the drain wire is overlapped toward an axial direction of the shield ring from an outer periphery of the shield ring, and deforming the pressed portion into a concave shape. According to a second aspect of the present invention, there is provided the connection method between a braided shield layer of a shield wire and a drain wire as described in the first aspect, wherein the crimping step is done with a pressing force so as to deform the conductive element wires of the drain wire and so as not to deform the conductive element wires of the braided shield layer.

According to a third aspect of the present invention, there is provided a connection structure between a braided shield layer of a shield wire and a drain wire for electrically connecting the drain wire composed of a plurality of conductive element wires with the braided shield layer provided as a most outer layer formed by braiding a plurality of conductive wire bundles each composed of a plurality of conductive element wires thinner than the conductive element wires of the drain wire, wherein a ring-shaped shield terminal is inserted over a vicinity of an end of the shield wire, an end side nearer than the shield terminal of the braided shield layer of the shield wire is folded and overlapped with an outer peripheral wall of the shield terminal, the drain wire is overlapped with a part of an outer side wall of the shield terminal where the braided shield layer is overlapped, a shield ring is inserted over the outer side wall of the shield terminal where the braided shield layer is overlapped and a portion where the drain wire is overlapped, a portion of the shield ring corresponding to the portion where the drain wire is overlapped is pressed toward an axial direction of the shield ring from an outer periphery of the shield ring and deformed into a concave shape, a portion of the conductive element wires of the drain wire held between the shield terminal and the shield ring is pressed and deformed, and the conductive element wires of the braided shield layer are locked between the shield terminal and the conductive element wires of the drain wire.

Advantageous Effects of Invention

According to the connection method between a braided shield layer of a shield wire and a drain wire of the present invention, an easy and reliable connection is available. Further, because a concave is finally formed on the shield ring, an end of the process can be extremely easily judged with eyes.

According to the connection structure between a braided shield layer of a shield. wire and a drain wire of the present invention, a reliable connection is available. Further, because a concave is finally formed on the shield ring, an end of the process can be extremely easily judged with eyes.

BRIEF DESCRIPTION OF DRAWINGS

[FIG. 1A]
FIG. 1A is a schematic diagram for explaining a connection method between a braided shield layer of a shield wire and a drain wire according to the present invention.

[FIG. 1B]
FIG. 1B is a schematic diagram for explaining the connection method between a braided shield layer of a shield wire and a drain wire according to the present invention.

[FIG. 1C]
FIG. 1C is a schematic diagram for explaining the connection method between a braided shield layer of a shield wire and a drain wire according to the present invention.

[FIG. 1D]
FIG. 1D is a schematic diagram for explaining the connection method between a braided shield layer of a shield wire and a drain wire according to the present invention.

[FIG. 1E]
FIG. 1E is a schematic diagram for explaining the connection method between a braided shield layer of a shield wire and a drain wire according to the present invention.

[FIG. 1F]
FIG. 1F is a schematic diagram for explaining the connection method between a braided shield layer of a shield wire and a drain wire according to the present invention.

[FIG. 1G]
FIG. 1G is a schematic diagram for explaining the connection method between a braided shield layer of a shield wire and a drain wire according to the present invention.

FIG. 2 is a schematic diagram Showing an example of a condition when the braided shield layer and the drain wire are connected to each other by the connection method between a braided shield layer of a shield wire and a drain wire.

FIG. 3 is a schematic diagram showing a conventional connection method between a braided shield layer of a shield wire and a drain wire.

DESCRIPTION OF EMBODIMENTS

Figure 2:
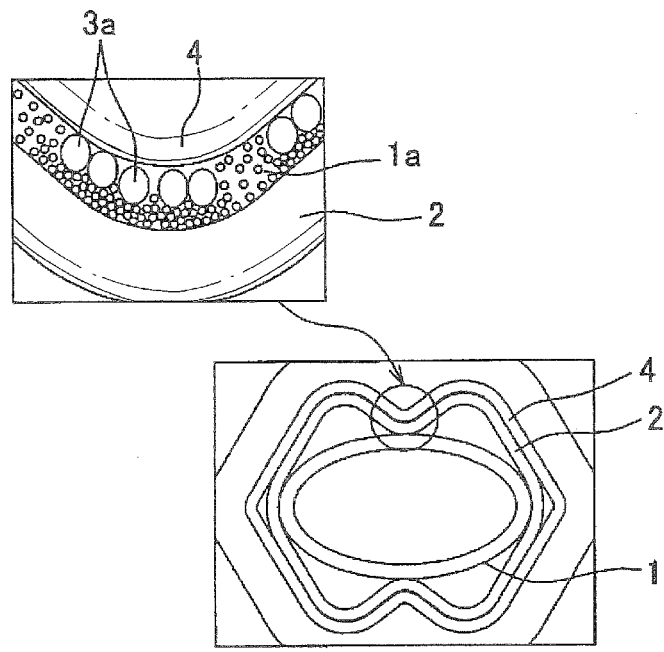
[FIG. 2]
Figure 3:
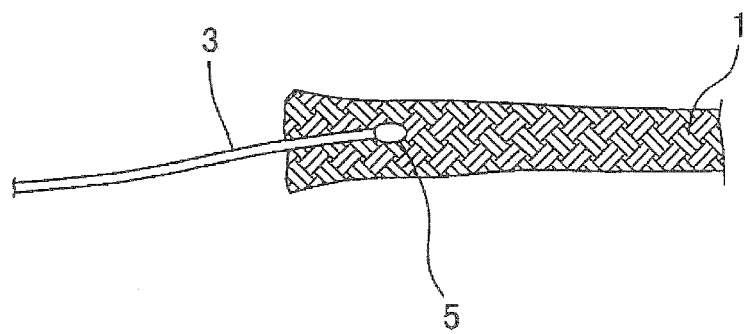
[FIG. 3]

A connection method between a braided shield layer of a shield wire and a drain wire according to the present invention will be explained with reference to figures.

FIG. 1A schematically shows a vicinity of an end of a braided shield layer 1a of a shield wire 1 to be connected to a drain wire 3.

In this embodiment, the braided shield layer 1a provided as a most outer layer of the shield wire 1 is formed by braiding a plurality of conductive wire bundles each composed of a plurality of (eighty in this embodiment) conductive element wires thinner than (outer diameter is 0.24 millimeters, made of metal plated fibers in this embodiment) later-described element wires of the drain wire.

A shield terminal 2 as schematically shown in a side view and a front view of FIG. 1B is inserted over from an end of the shield wire 1 (FIG. 1C shows a schematic side view and a schematic sectional view of line A-A). The maneuvering gear 2 is composed of a ring portion 2a and an enlarged radius portion 2b connected to the ring portion 2a via a step portion 2a1 and having a larger radius than the ring portion 2a.

An inner enlarged radius portion 2c having a larger inner radius than an inner side wall of the ring portion 2a is formed on an inner side wall of the enlarged radius portion 2b. Owing to the inner enlarged radius portion 2c, an operation of inserting the shield terminal 2 over the shield wire 1 from the enlarged radius portion 2b side becomes easy and sure, and an unnecessary curl of the braided shield layer 1a is prevented from being generated upon this operation.

After a shield terminal insertion step for inserting the ring-shaped shield terminal 2 over a vicinity of an end of the shield wire 1 as schematically shown in FIG. 1C, a shield layer folding and overlapping step for folding an end side nearer than the shield terminal 2 of the shield wire 1 and overlapping with an outer peripheral wall of the shield terminal 2 is done as shown in a schematic side view and a schematic sectional view taken on line A-A of FIG. 1D.

According to this embodiment, an enlarged radius portion 2b is provided on the shield terminal 2. The braided shield layer 1a is overlapped over the whole ring portion 2a of the shield terminal 2. Namely, in the shield terminal insertion step, an insertion position of the shield terminal 2 is determined so as to position an end of the braided shield layer 1a on the step portion 2a1 of the shield terminal 2.

Incidentally, in FIG. 1C, a reference sign 1b denotes a wire main body which had been covered by the braided shield layer 1a of the shield wire 1.

Next, a drain wire overlapping step for overlapping the drain wire 3 with a part of an outer side wall of the shield terminal 2 where the braided shield layer 1a is overlapped is done. The drain wire 3 of this embodiment is made by braiding eighty conductive element wires thinner (in this embodiment, the outer diameter is 0.024 millimeters, made of metal plated fiber) than the conductive element wires of the braided shield layer 1a. In this drain wire overlapping step, preferably, a part of an end of the drain wire 3 is braided back so that a drain wire overlapping portion is not too thicker than the other portions. Thereby, the electric contact property between the drain wire 3 and the braided shield layer 1a is improved, and the durability of the electric contact is improved.

Next, a shield ring inserting step for inserting a shield ring 4 over the outer side wall where the braided shield layer 1a is overlapped and a portion where the drain wire 3 is overlapped is done.

FIG. 1F schematically shows a front view and a partially sectional view of the shield ring 4. An inner diameter of the shield ring 4 is larger than an outer diameter of the outer side wall where the braided shield layer 1a is overlapped and the portion where the drain wire 3 is overlapped, and smaller than an outer diameter of the enlarged radius portion 2b of the shield terminal 2. Further, a length of the shield ring 4 is equal to a length of the ring portion 2a of the shield terminal 2. In this step, the shield ring 4 is inserted till it reaches the step portion 2a1 of the shield terminal 2.

Then, as the final step, as shown in a schematic sectional view and an enlarged schematic sectional view enlarging a part of the drain wire 3 in FIG. 2, a crimping step for pressing a portion of the shield ring 4 corresponding to the portion where the drain wire 3 (its conductive element wires 3a) is overlapped toward an axial direction of the shield ring 4 from an outer periphery of the shield ring 4, and deforming the pressed portion into a concave shape (forming an indent) is done.

As shown in the schematic sectional view of FIG. 2, this crimping step is done by such a pressing force so that the conductive element wires 3a of the drain wire 3 are deformed, and the conductive element wires of the braided shield layer 1a are not deformed. Thereby, a good connecting condition is attained with high connecting strength and low connecting resistance.

Because the conductive element wire composing the braided shield layer 1a is thin, when the stress is concentrated at one point of the conductive element wire, the conductive element wire may be cut off. However, according to the above configuration, in the crimping step, firstly the crimping force is applied to the conductive element wires 3a of the drain wire 3 thicker than the conductive element wires of the braided shield layer 1a at a portion held between the shield terminal 2 and the shield ring 4, and shapes of the conductive element wires 3a of the drain wire 3 are deformed. Further, while the conductive element wires of the braided shield layer 1a are locked between the shield terminal 2 and the conductive element wires 3a of the drain wire 3, the shield ring 4 is crimped. Thereby, a good connecting condition is attained.

When an indent is formed on the overlapped portion of the drain wire 3 (its conductive element wires 3a) as described above, the connecting strength is further increased. Such a crimping process for forming the indent is possible by hexagonal crimping (for example, see FIG. 2), swaging, or the like.

REFERENCE SIGNS LIST 1 shield wire
1a braided shield layer
1b wire main body
2 shield terminal
2a ring portion
2a1 step portion
2b enlarged radius portion
2c inner enlarged radius portion
3 drain wire
3a conductive element wire of the drain wire
4 shield ring

The invention claimed is:

1. A connection method between a braided shield layer of a shield wire and a drain wire for electrically connecting the drain wire composed of a plurality of conductive element wires with the braided shield layer provided as a most outer layer formed by braiding a plurality of conductive wire bundles each composed of a plurality of conductive element wires thinner than the conductive element wires of the drain wire, said connection method sequentially comprising the steps of:
a shield terminal insertion step for inserting a ring-shaped shield terminal over a vicinity of an end of the shield wire, the shield terminal having an enlarged radius portion via a step portion;
a shield layer folding and overlapping step for folding an end side nearer than the shield terminal of the braided shield layer of the shield wire and overlapping with an outer side wall of the shield terminal so that an end side of the braided shield layer is positioned on the step portion;
a drain wire overlapping step for overlapping the drain wire with a part of the outer side wall of the shield terminal where the braided shield layer is overlapped;
a shield ring inserting step for inserting a shield ring over the outer side wall where the braided shield layer is overlapped and a portion where the drain wire is overlapped until the step portion of the shield terminal is reached; and
a crimping step for pressing a portion of the shield ring corresponding to the portion where the drain wire is overlapped toward an axial direction of the shield ring from an outer periphery of the shield ring, and deforming the pressed portion into a concave shape.

2. The connection method between a braided shield layer of a shield wire and a drain wire as claimed in claim 1, wherein the crimping step is done with a pressing force so as to deform the conductive element wires of the drain wire and so as not to deform the conductive element wires of the braided shield layer.

3. A connection structure between a braided shield layer of a shield wire and a drain wire for electrically connecting the drain wire composed of a plurality of conductive element wires with the braided shield layer provided as a most outer layer formed by braiding a plurality of conductive wire bundles each composed of a plurality of conductive element wires thinner than the conductive element wires of the drain wire,
wherein a ring-shaped shield terminal having an enlarged radius portion via a step potion is inserted over a vicinity of an end of the shield wire, an end side nearer than the shield terminal of the braided shield layer of the shield wire is folded and overlapped with the outer side wall of the shield terminal, so that an end side of the braided shield layer is positioned on the step portion, the drain wire is overlapped with a part of the outer side wall of the shield terminal where the braided shield layer is overlapped, a shield ring is inserted over the outer side wall of the shield terminal where the braided shield layer is overlapped and a portion where the drain wire is overlapped, until the step portion of the shield terminal is reached, a portion of the shield ring corresponding to the portion where the drain wire is overlapped is pressed toward an axial direction of the shield ring from an outer periphery of the shield ring and deformed into a concave shape, a portion of the conductive element wires of the drain wire held between the shield terminal and the shield ring is pressed and deformed, and the conductive element wires of the braided shield layer are locked between the shield terminal and the conductive element wires of the drain wire.

* * * * *